United States Patent
Yano

(10) Patent No.: US 9,275,739 B2
(45) Date of Patent: Mar. 1, 2016

(54) SEMICONDUCTOR MEMORY DEVICE, READING METHOD, AND PROGRAMMING METHOD

(71) Applicant: Winbond Electronics Corp., Taichung (TW)

(72) Inventor: Masaru Yano, Tokyo (JP)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 14/332,405

(22) Filed: Jul. 16, 2014

(65) Prior Publication Data

US 2015/0155043 A1    Jun. 4, 2015

(30) Foreign Application Priority Data

Dec. 4, 2013    (JP) .................................. 2013-250787

(51) Int. Cl.
*G11C 16/04*    (2006.01)
*G11C 16/10*    (2006.01)
(Continued)

(52) U.S. Cl.
CPC ............ *G11C 16/10* (2013.01); *G11C 16/0441* (2013.01); *G11C 16/0483* (2013.01); *G11C 16/26* (2013.01); *G11C 16/28* (2013.01)

(58) Field of Classification Search
CPC ........ G11C 16/10; G11C 16/26; G11C 16/28; G11C 16/0441; G11C 16/0483
USPC ............. 365/185.11, 185.17, 185.18, 185.19, 365/185.29, 185.05
See application file for complete search history.

(56) References Cited

U.S. PATENT DOCUMENTS

| | | | | |
|---|---|---|---|---|
| 6,191,972 B1* | 2/2001 | Miura | ..................... | G11C 11/15 365/158 |
| 6,341,084 B2* | 1/2002 | Numata | ........................ | 365/158 |
| 6,504,752 B2* | 1/2003 | Ito | .......................... | G11C 11/16 365/158 |

(Continued)

FOREIGN PATENT DOCUMENTS

| | | |
|---|---|---|
| JP | 2012133834 | 7/2012 |
| JP | 2013118031 | 6/2013 |

(Continued)

OTHER PUBLICATIONS

"Office Action of Taiwan Counterpart Application", issued on Sep. 24, 2015, p. 1-p. 7, in which the listed reference was cited.

(Continued)

*Primary Examiner* — Gene Auduong
(74) *Attorney, Agent, or Firm* — Jianq Chyun IP Office

(57) ABSTRACT

The invention provides a NAND-type semiconductor memory device capable of high speed operation. A semiconductor memory device of the invention includes: a memory array, which forms a plurality of memory cells arranged in a matrix direction; a vertical selecting mechanism, which couples to the memory array, and selects the memory cells in a vertical direction of the memory array according to a vertical address signal; a horizontal selecting mechanism, which couples to the memory array, and selects the memory cells in a horizontal direction of the memory array according to a horizontal address signal; and a controlling mechanism, which reads data from the memory cells or writes data into the memory cells. A plurality of cell units is disposed in the memory array. Each cell unit is consisted of a data memory cell which storages data and a reference memory cell which storages reference data.

16 Claims, 7 Drawing Sheets

(51) Int. Cl.
*G11C 16/26* (2006.01)
*G11C 16/28* (2006.01)

(56) References Cited

U.S. PATENT DOCUMENTS

| | | | |
|---|---|---|---|
| 6,791,859 B2* | 9/2004 | Hush | G11C 7/062 |
| | | | 365/100 |
| 6,870,758 B2* | 3/2005 | Anthony | G11C 11/15 |
| | | | 365/158 |
| 7,269,065 B2* | 9/2007 | Miyamoto | G11C 16/28 |
| | | | 365/185.17 |
| 7,869,249 B2* | 1/2011 | Hush | G11C 7/062 |
| | | | 365/100 |
| 2004/0208061 A1 | 10/2004 | Toda | |
| 2006/0104114 A1 | 5/2006 | Toda | |
| 2008/0273384 A1 | 11/2008 | Sarin et al. | |
| 2011/0110152 A1 | 5/2011 | Sarin et al. | |
| 2013/0258782 A1 | 10/2013 | Tatsumura et al. | |

FOREIGN PATENT DOCUMENTS

| | | |
|---|---|---|
| KR | 20100091407 | 8/2010 |
| TW | 201225086 | 6/2012 |

OTHER PUBLICATIONS

"Office Action of Korea Counterpart Application" with English Translation, issued on Sep. 16, 2015, p. 1-p. 7, in which the listed reference was cited.

* cited by examiner

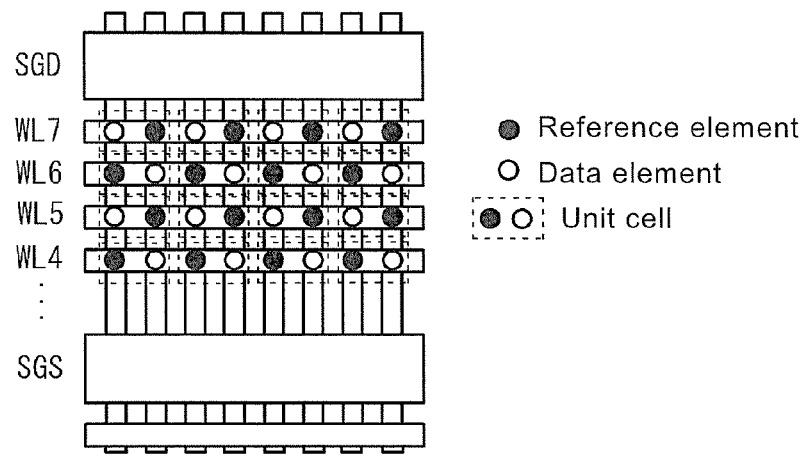
FIG.5
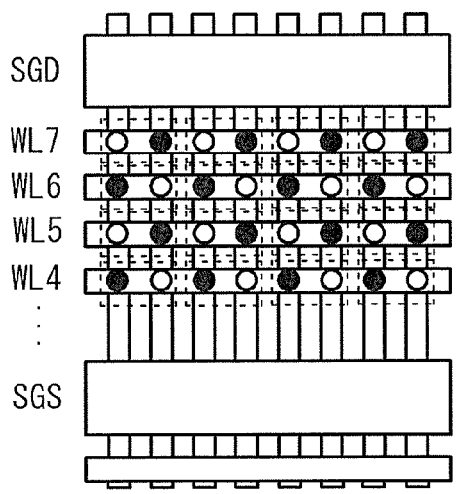 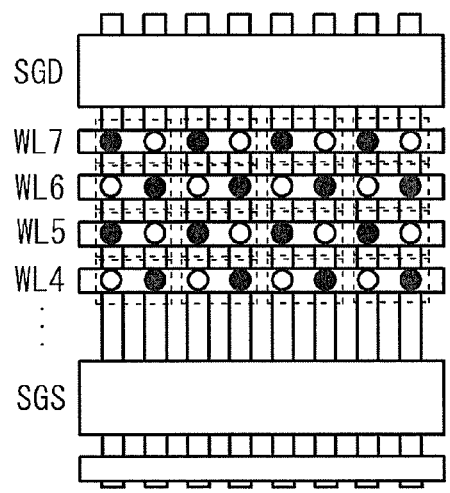
FIG.6A  FIG.6B

SEMICONDUCTOR MEMORY DEVICE, READING METHOD, AND PROGRAMMING METHOD

CROSS-REFERENCE TO RELATED APPLICATION

This application claims the priority benefit of Japan application serial no. 2013-250787, filed on Dec. 4, 2013. The entirety of the above-mentioned patent application is hereby incorporated by reference herein and made a part of this specification.

BACKGROUND OF THE INVENTION

1. Field of the Invention

The invention generally relates to a semiconductor memory device, and more particularly, to an operation method enabling high speed reading and writing.

2. Description of Related Art

Generally, an NAND-type (Not AND type) flash memory, such as a flash memory disclosed in below, is known to include a memory array containing NAND strings that connects a plurality of memory cell in series, and a page buffer connected to bit lines in the memory array, wherein the page buffer maintains data transmitted from a selected page of the memory array or maintains data used to programming the selected page. This type of page buffer includes a data register and a cache register, so as to achieve high speed reading and programming (reference patent 1).

PRIOR PART

Reference Patent

Reference patent 1: Japanese publication No. 2013-118031

In a reading operation of the NAND-type flash memory, since the bit lines are precharged by a sense circuit, it is very time-consuming when performing the reading. The NAND-type flash memory reads or programs (writes) in units of pages, and is unable to perform random access as similar to a NOR-type (Not OR type) flash memory.

SUMMARY OF THE INVENTION

Accordingly, the invention is directed to a semiconductor memory device capable of high speed operation. In addition, the invention is further directed to a semiconductor memory device enabling random access.

A semiconductor memory device of the invention includes: a memory array formed with a plurality of memory cells arranged in a matrix direction; a vertical selecting mechanism coupled to the memory array and selecting the memory cells in a vertical direction of the memory array according to a vertical address signal; a horizontal selecting mechanism coupled to the memory array and selecting the memory cells in a horizontal direction of the memory array according to a horizontal address signal; and a controlling mechanism reading data from the memory cells or writing data into the memory cells. A plurality of cell units is disposed in the memory array. Each cell unit is consisted of a data memory cell for storing data and a reference memory cell for storing reference data. The controlling mechanism performs a reading operation, a programming operation or an erasing operation to one cell unit selected by the vertical selecting mechanism and the horizontal selecting mechanism Preferably, one data memory cell is not adjacent to another data memory cell in both a vertical direction and a horizontal direction thereof. Preferably, the controlling mechanism includes a sense circuit connected to a bit line of the memory cells. The data memory cell and the reference memory cell of the selected cell unit are simultaneously being read when performing a reading operation. The sense circuit compares currents read from the data memory cell and the reference memory cell to determine the data stored in the data memory cell. Preferably, when performing a programming operation, the controlling mechanism writes a value for determining the data in the data memory cell of the selected cell unit into the reference memory cell of the selected cell unit. Preferably, the data memory cell writes a first reference data into the reference memory cell when storing a first data, and the data memory cell writes a second reference data different from the first reference data into the reference memory cell when storing a second data. Preferably, the controlling mechanism writes the first data, the first reference data and the second reference data by applying a writing pulse. Preferably, a written pulse number of the first reference data is less than a written pulse number of the first data, and a written pulse number of the second reference data is between the written pulse number of the first data and the written pulse number of the first reference data. For example, when the written pulse number of the first data is N1, the written pulse number of the first reference data is R1, and the written pulse number of the second reference data is R2, then $R1=N1-2$ and $R2=N1-1$. Preferably, the controlling mechanism performs is an erasing operation to the memory array in units of blocks, and the controlling mechanism further reverses positions of the data memory cells and the reference memory cells in the cell units in a block underwent the erasing operation.

A reading method of the invention is suitable for a semiconductor memory device. The semiconductor memory device includes a memory array formed with a plurality of memory cells arranged in a matrix direction. The reading method includes: reading the memory array disposed with a plurality of cell units based on a vertical address information and a horizontal address information, wherein each cell unit is constituted of a data memory cell for storing data and a reference memory cell for storing reference data; and comparing currents read from the data memory cell and the reference memory cell of the selected cell unit to determine the data stored in the data memory cell.

A programming method of the invention is suitable for a semiconductor memory device. The semiconductor memory device includes a memory array formed with a plurality of memory cells arranged in a matrix direction. The writing method includes: programming the memory array disposed with a plurality of cell units based on a vertical address information and a horizontal address information, wherein each cell unit is constituted of a data memory cell for storing data and a reference memory cell for storing reference data; and writing the data memory cell of the selected cell unit according to a written data and writing a value depending on the written data into the reference memory cell thereof.

EFFECT OF THE INVENTION

In view of the foregoing, by performing reading and writing in units of cell units constituted of the data memory cell and the reference memory cell, the present invention, as compared to the conventional NAND-type flash memory, can achieve random access and high speed operation in a NAND-type flash memory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a configuration diagram of data memory cells and reference memory cells according to an embodiment of the invention.

FIG. 6A and FIG. 6B illustrate configuration diagrams of the cell units according to an embodiment of the invention.

DESCRIPTION OF THE EMBODIMENTS

The invention is directed to a semiconductor memory device formed with a NAND-type flash memory array that is capable of random accessing memory cells and achieving a higher data reading speed than a typical flash memory. In terms of erasing data, the semiconductor memory device is capable of erasing the data in units of blocks as similar to the typical flash memory. More preferably, the semiconductor memory device of the invention may further have interchangeability, such as, being able to execute operations similar to the typical flash memory.

In the following, reference will now be made in detail to the present preferred embodiments of the invention, examples of which are illustrated in the accompanying drawings. Besides, it is to be noted that, in the accompanying drawings, various parts are being emphasized for an ease of understanding, and thus are different from the actual device in scales.

Embodiment

Figure 1:
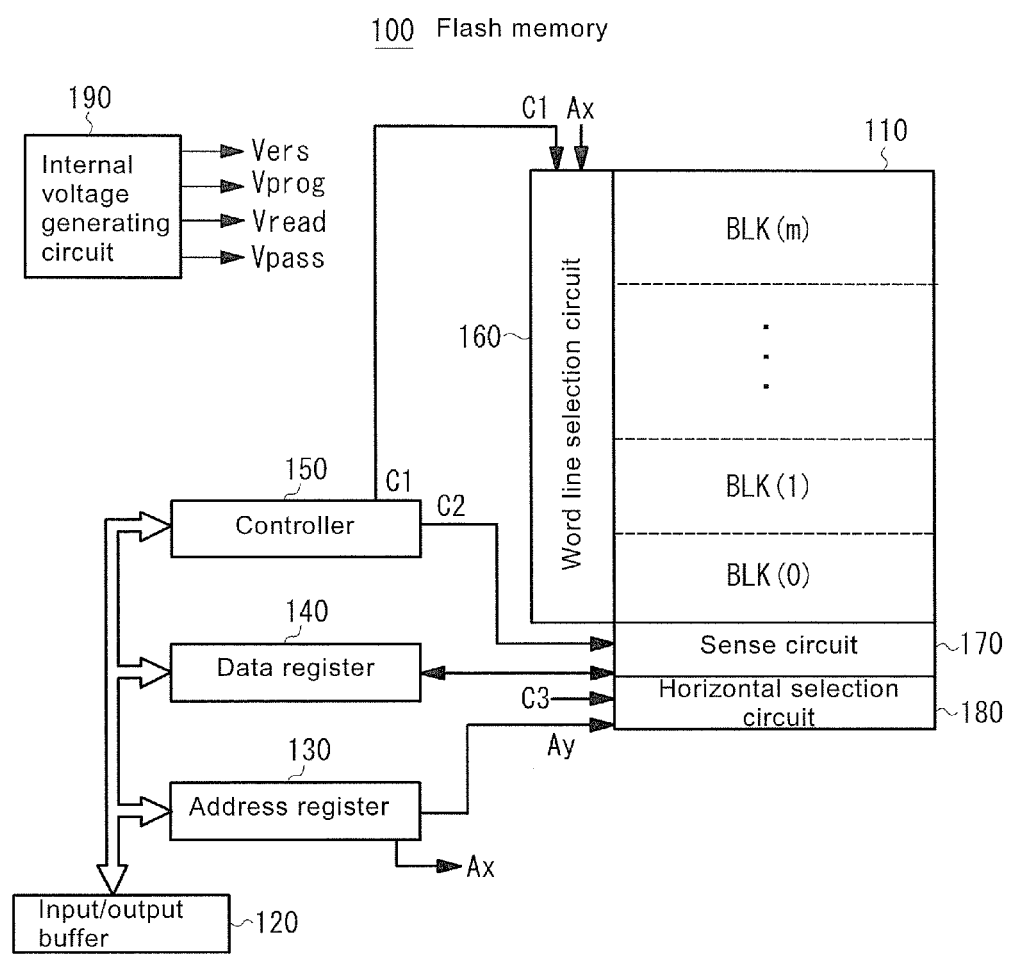
FIG. 1 is a block diagram illustrating a semiconductor memory device according to an embodiment of the invention.

FIG. 1 is a block diagram illustrating a semiconductor memory device according to an embodiment of the invention. However, the structure of the flash memory illustrated herein is merely provided as an example; the invention is not limited thereto.

A flash memory 100 of the present embodiment includes: a memory array 110 formed with a plurality of memory cells arranged in a vertical and horizontal direction; an input/output buffer 120 connected to an external input/output terminal I/O and maintaining input/output data; an address register 130 receiving address data from the input/output buffer 120; a data register 140 maintaining the input/output data; a controller 150 providing a control signal C1, a control signal C2, a control signal C3 and so forth, wherein the control signal C1, the control signal C2, the control signal C3 and so forth control each part based on command data and external control signals (e.g., chip enable or address latch enable) from the input/output buffer 120; a word line selection circuit 160 decoding a vertical address information Ax from the address register 130 and performing a memory block selection and a word line selection according to the decoding result; a sense circuit 170 maintaining data being read from a bit line or maintaining data being written through the bit line; a horizontal selection circuit 180 decoding a horizontal address information Ay from the address register 130 and performing a bit line selection according to the decoding result; and an internal voltage generating circuit 190 generating voltage (e.g., programming voltage Vprog, passing voltage Vpass, reading voltage Vread, or erasing voltage Vers) required for reading, programming, and erasing data.

The memory array 110 has a plurality of memory blocks BLK(0), BLK(1) . . . BLK(m) disposed along a horizontal direction. An end of each block is disposed with the sense circuit 170. However, the sense circuit 170 may also be disposed at another end or both ends of the block.

Figure 2:
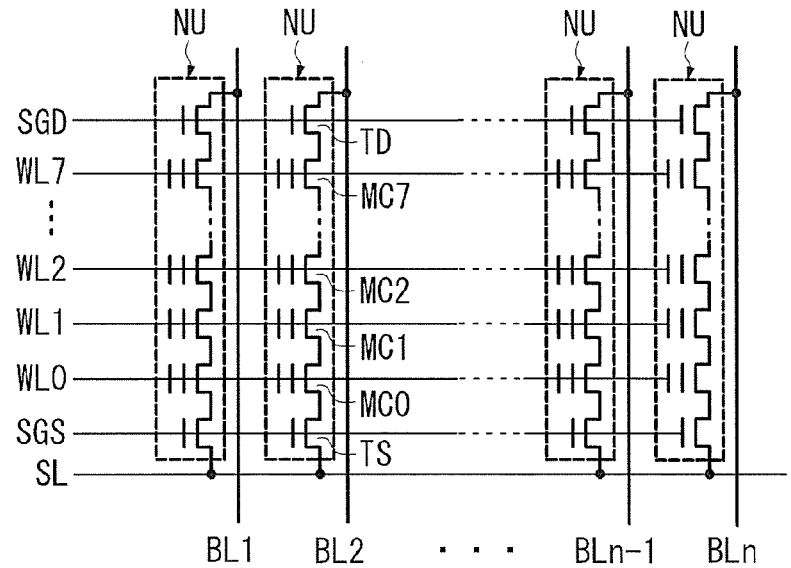
FIG. 2 is a circuit diagram representing the structure of NAND strings in a memory array according to an embodiment of the invention.

As shown in FIG. 2, within each memory block, n NAND strings NU are arranged along a vertical direction. Each NAND string NU includes eight memory cells MCi (i=0, 1 . . . 7) that are connected in series, a selection transistor TD connected at one end (viz., a drain of the memory cell MC7) thereof, and a selection transistor TS connected to another end (viz. a source of the memory cell MC0) thereof. The drain of the selection transistor TD is connected to one corresponding bit line BL, and the source of the selection transistor TS is connected to a common source line SL.

A control gate of each memory cell MC1 is connected to the word line WLi, and gates of the selection transistor TD and the selection transistor TS are connected to a selected gate line SGD and a selected gate line SGS parallel to the word line WL. When selecting the memory block based on the vertical address Ax, the word line selection circuit 160 selectively drives the selection transistor TD and the selection transistor TS via a selection gate signal of the memory block.

The sense circuit 170 includes a plurality of sense amplifiers connected by the bit lines BL. Each sense amplifier includes a differential input connected to an even bit line and an odd bit line, so as to compare the inputted voltage or current and maintain a comparison result, or provide the comparison result to the data register 140. Moreover, the sense amplifiers may receive data from the data register 140 and feed the data to the bit lines. When one block is formed with n NAND strings, the sense circuit 170 includes n/2 sense amplifiers. The sense amplifiers may include well-known circuits, such as, differential amplifier circuits or so, and the differential amplifier circuits include I-V conversion circuits for converting currents that flow through the bit lines into voltages. In addition, a bit line selection circuit is configured between the sense circuit 170 and the bit lines, and the bit line selection circuit connects the selected bit lines to the sense amplifiers according to a selection signal from the horizontal selection circuit 180. As such, the sense amplifiers may be constituted in an activative or a non-activative manner by the selection signal from the horizontal selection circuit 180.

Figure 4:
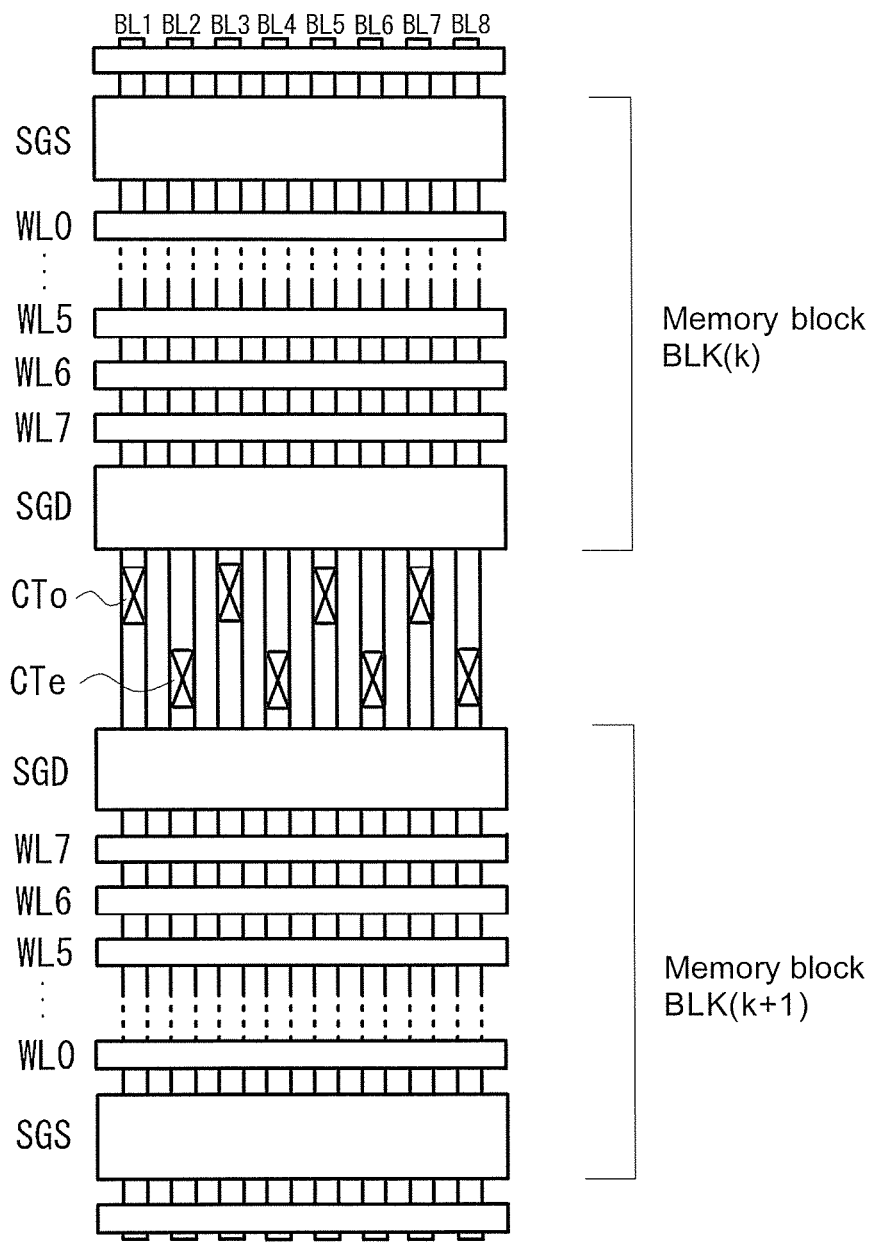
FIG. 4 is a plan view illustrating a schematic layout of the NAND strings according to an embodiment of the invention.

FIG. 4 is a plan layout of the memory block BLK(k) and memory block BLK(k+1) strings NU, which shows the polysilicon wirings that constituted the word lines WL0 to WL7 and the selected gate line SGD/SGS of the selection transistor TD/TS. CTo is used to connect a metal wiring that constituted the odd bit line to a contact hole in a drain diffusion region of the selection transistor TD, and CTe is used to connect a metal wiring that constituted the even bit line to the contact hole in the drain diffusion region.

In the present embodiment, each memory block is formed with eight word lines therein, thereby having an amount of word lines less than a typical NAND-type flash memory. Therefore, disturbances in the memory cells generated due to programming may be suppressed and high speed reading, writing and erasing operations may be achieved, but the invention is not limited thereto. The amount of word lines in each memory block may also be more than eight.

Figure 3:
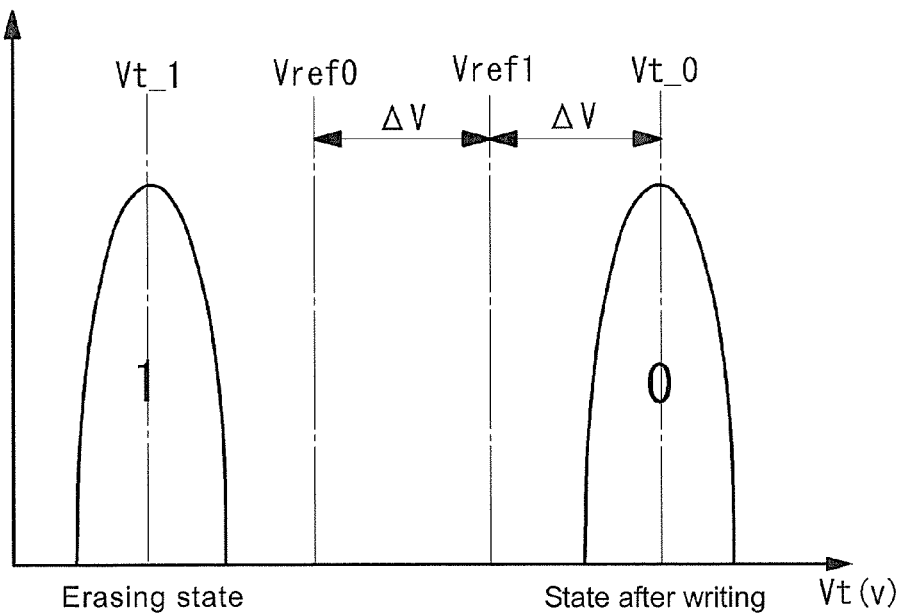
FIG. 3 illustrates distribution widths of threshold values $Vt\_0$ and $Vt\_1$ when "0" or "1" is being stored in memory cells.

The memory cell typically has a metal oxide semiconductor (MOS) structure, and the MOS structure includes: sources/drains formed within a P well and used as a N-type diffusion region; a tunnel oxide film formed in a tunnel between the sources/drains; a floating gate (charge accumulation layer) formed on the tunnel oxide film; and a control gate formed on the floating gate via a dielectric film. When charges are not accumulated in the floating gate, i.e., when data "1" is being stored, a threshold value thereof is in a negative state, and the memory cells are normally on. When electrons accumulated in the floating gate, i.e., when data "0" is being stored, a threshold shift thereof is positive, and the memory cells are normally off FIG. 3 illustrates distribution widths of threshold values Vt_0 and Vt_1 when "0" or "1" is being stored in memory cells.

Table 1 lists the bias voltages applied by the flash memory when performing various operations. During the reading operation, a positive voltage is applied to the bit line, a voltage Vx is applied to the selected word line, a reading voltage Vread (such as 4.5 V) is applied to the un-selected word line, and positive voltages (such as 4.5 V) are applied to the selected gate line SGD and the selected gate line SGS, so that the bit line selection transistor TD and the source line selection transistor TS are conducted to apply 0 V to the common source line. During the writing operation, a programming voltage Vprog (such as a high voltage of 15 V to 20 V) is applied to the selected word line and an intermediate electric potential (such as 10 V) is applied to the un-selected word line, so that the bit line selection transistor TD is conducted to disconnect the source line selection transistor TS and feed an electric potential corresponded to a writing target or a writing prohibited memory cell to the bit line BL. During the erasing operation, 0 V is applied to the selected word line within the memory block, a high voltage (such as 21 V) is applied to the P well, and the electrons of the floating gate are extracted to the substrate, so that data are erased in units of blocks.

TABLE 1

|  | Erasing | Writing | Reading |
|---|---|---|---|
| Selected word line | 0 V | 15 V~20 V | Vx |
| Un-selected word line | floating | 10 V | 4.5 V |
| SGD | floating | Vcc | 4.5 V |
| SGS | floating | 0 V | 4.5 V |
| SL | floating | Vcc | 0 V |
| P well | 21 V | 0 V | 0 V |

The memory array of the present embodiment is configured with a data memory cell (hereinafter referred to as a data element) stored with data "0" or data "1" and a reference memory cell (hereinafter referred to as a reference element) stored with the reference data. Moreover, one data element and one reference element adjacent to this data element together constitutes a cell unit, wherein the reference element and the data element share the word line.

In the present embodiment, data "1" is stored in an erasing element, and reference data used for determining data "1" is stored in the reference element paired with the erasing element; data "0" is stored in a programming element, and reference data used for determining data "0" is stored in the reference element paired with the programming element. Specifically, referring to FIG. 3, in the erasing element, data for setting the threshold value Vt_1 is stored, and in the reference element for the erasing element, reference data for setting the threshold value Vref1 is stored; in the programming element, data for setting the threshold value Vt_0 is maintained, and in the reference element for the programming element, reference data for setting the threshold value Vref0 is stored. As described below, when performing the reading operation, one cell unit including the data element and the reference element is selected, currents or voltages generated by the data element and the reference element are compared by the sense circuit 170, and data stored by the data element are sensed. In addition, when performing the programming operation, writing of the programming element and the reference element is executed, so that the reference element may be set to the threshold value Vref0 for the programming element and the threshold value Vref1 for the erasing element.

FIG. 5 is a configuration diagram of data elements and reference elements in the memory blocks. In the drawing, ● represents reference elements, and ○ represents data elements. As shown in FIG. 5, an approach of forming the reference elements on the even bit lines of the word line WL7 and forming the reference elements on the odd bit lines of the word line WL6 configures the reference element into a grid pattern or a checkerboard shape. Moreover, the data elements are disposed between the reference elements, such that one data element is not adjacent to another data element in both the vertical direction and the horizontal direction. By surrounding the four sides of the data element with the reference elements, the programming element is prevented from being adjacent to the erasing element, thereby suppressing unnecessary capacitive coupling between the floating gates of the programming element and the erasing element, and thus disturbances during the programming operation may be eliminated.

FIG. 6A and FIG. 6B are configuration diagrams illustrating the cell units in the memory blocks. In the drawings, dashed line represents a cell unit consisted of one reference element and one data element, and in the examples shown in FIG. 6A and FIG. 6B, the positions of the data element and the reference element are reversed. The reference elements, as shown in FIG. 5, are alternatively spaced in the vertical direction and the horizontal direction, and the data elements are formed between the reference elements. Each cell unit includes a pair of one data element and one reference element adjacent to each other in the vertical direction and sharing the word line. In the present embodiment of the invention, since the reference elements are programmed with the threshold values that allow currents to always flow through when being selected, the reference elements may deteriorate faster than the data elements. Therefore, in a preferred embodiment, the controller 150 manages address information which allocates the data elements and the reference elements in units of blocks, and after performing the erasing operation of the memory blocks, the controller 150 controls the programming sequence to reverse configuration of the data elements and the reference elements within the memory blocks from the one shown FIG. 6 (A) to FIG. 6 (B). Thus, the invention may uniform the deterioration or the characteristic changes of the memory cells within the memory blocks by reversing the position of the data elements and the reference elements.

Figure 7:
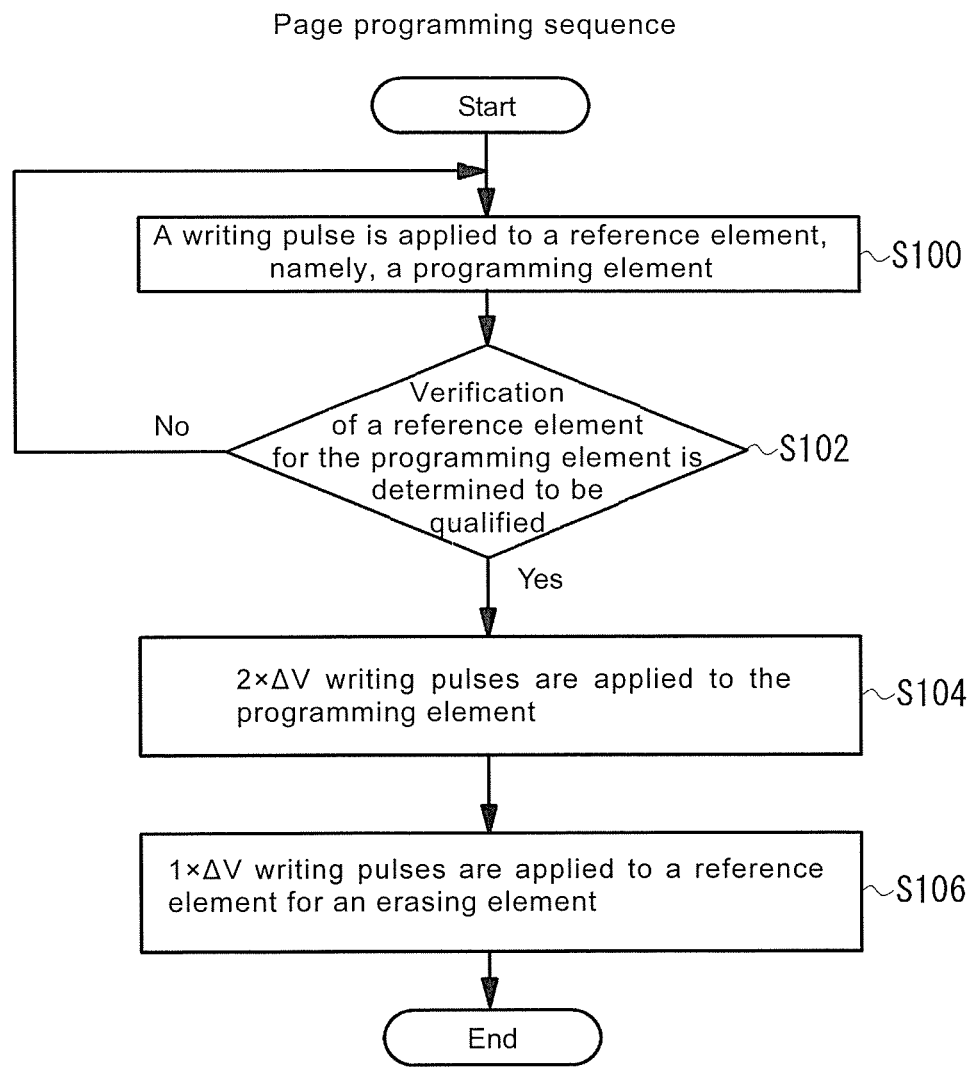
FIG. 7 illustrates a flow chart of a page programming sequence according to an embodiment of the invention.

Next, operations of the flash memory of the present embodiment are described as follows. Firstly, page programming sequence is described in the following. FIG. 7 illustrates a flow chart of a page programming sequence according to an embodiment of the invention, and FIG. 8A, FIG. 8B and FIG. 8C are diagrams illustrating states of the reference element and the data element when performing the page programming sequence.

Figure 8A:
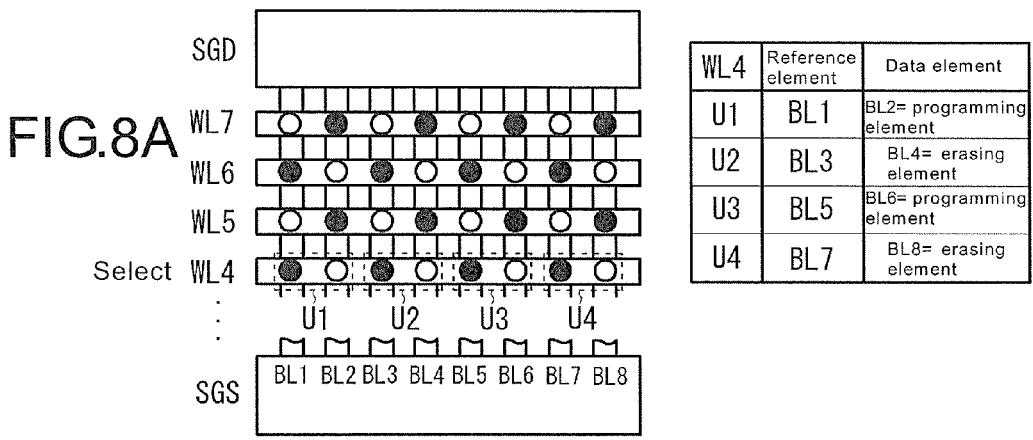
FIG. 8A, FIG. 8B and FIG. 8C are diagrams illustrating states of the reference element and the data element when performing the page programming sequence.
Figure 8B:
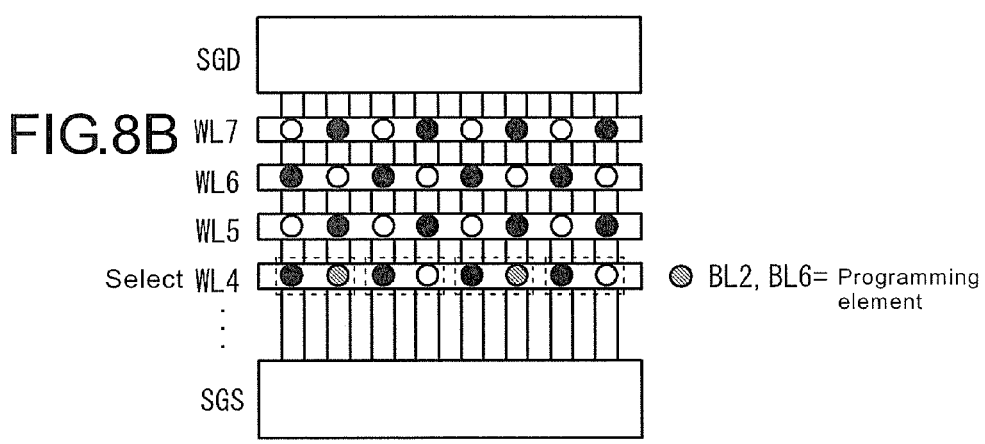
Figure 8C:
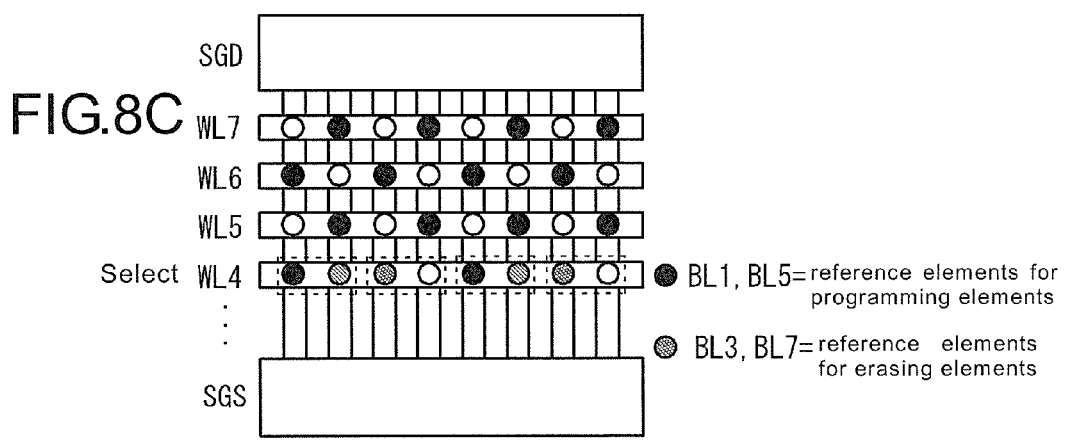

Referring to FIG. 7 and FIG. 8A through FIG. 8C. The controller 150 starts a page programming in response to command, written data and address information received from the outside. Herein, assuming that after the erasing operation of the memory blocks is performed, the word line WL4 shown in FIG. 8A is selected, and then the word line WL4 is being written. Moreover, the word line WL4 includes cell unit U1 to cell unit U4, and the cell unit U1 to cell unit U4 respectively include the pairs consisted of the reference elements on the odd bit lines and the data elements on the even bit lines. The data elements on even bit line BL2 and even bit line BL6 are programming elements which store data "0", and the data elements on even bit line BL4 and even bit line BL8 are erasing elements which store the data "1".

In the embodiment of the invention, the programming elements on the even bit line BL2 and the even bit line BL6 are writing target elements, and the erasing elements on the even bit line BL4 and the even bit line BL8 are writing prohibited elements. Moreover, the reference elements on odd bit line B1, odd bit line B3, odd bit line B5 and odd bit line B7 are set to threshold values that allow currents to always flow through when being selected, and thus the reference elements are also the writing target elements. The sense circuit 170 feeds a voltage capable of writing the data, such as 0V, to the bit lines of the writing target elements, and feeds a voltage required to prohibit data writing, such as 3.3 V or Vdd voltage, to the bit lines of the writing prohibited elements. Besides, the word line selection circuit 160 applies a writing pulse generated by the internal voltage generating circuit 190 to the selected word line WL4, and applies an intermediate voltage (such as 10 V) to the un-selected word line. As such, page programming are performed by applying writing pulses to the reference elements on the selected word line WL4 and the programming elements on the bit line BL2 and the bit line BL6 (S100).

Under the control of the controller 150, the reference elements for the programming elements are being programmed until the threshold value Vt=Vref0 (i.e., Vref0=0 V or Vref0>0 V). Next, the sense circuit 170 detects the threshold values of the reference elements for the programming element and verifies whether the threshold values are qualified or not based on the detection results (S102). In an embodiment, the sensing element, for example, performs the verification by detecting drain currents Id of the reference elements for the programming elements or detecting voltages converted from the drain currents Id.

Figure 9A:
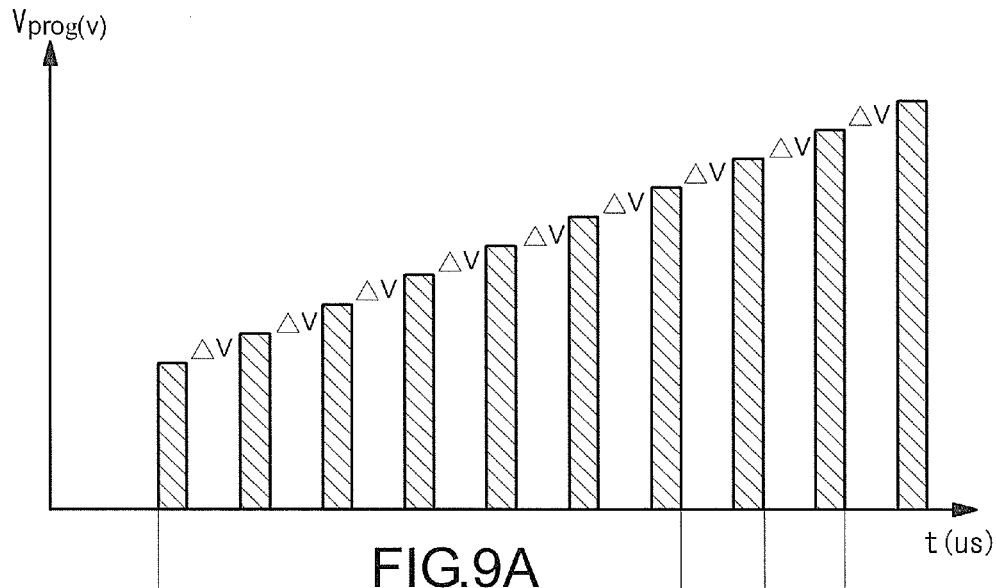
FIG. 9A, FIG. 9B and FIG. 9C illustrate relationships between a written pulse number of ISPP and threshold value of the reference element and the data element.
Figure 9B:
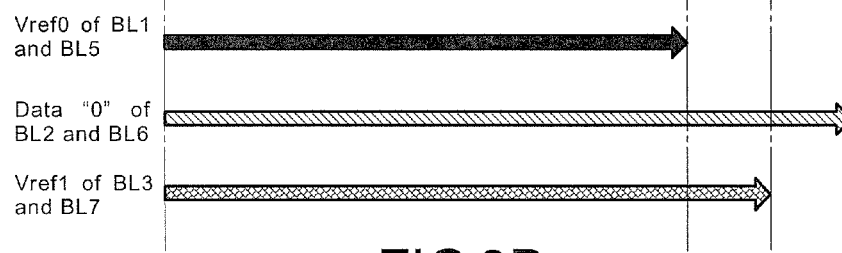
Figure 9C:
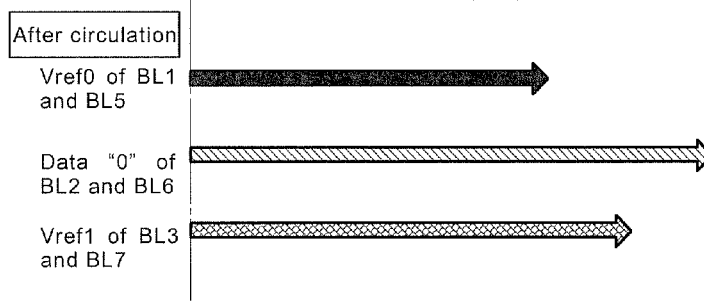

FIG. 9A, FIG. 9B and FIG. 9C illustrate relationships between a written pulse number of ISPP (Incremental Step Pulse Program) and threshold value of the reference element and the data element. In the drawing, one writing pulse is set to merely shift a threshold value ΔV of the memory cell. As indicated in FIG. 9A, FIG. 9B and FIG. 9C, when applying seven times of writing pulses to the reference elements for the programming elements, the verification is qualified. Now, the threshold value Vref0 for determining data of the programming elements is stored in the reference elements (viz., the reference elements on the bit line BL1 and the bit line BL5) for the programming elements.

Subsequently, the writing prohibited voltages are fed to the bit lines other than that of the programming elements, and by taking the written pulse number obtained when the verification of the reference elements for the programming elements is determined as qualified as a basis, the writing pulse is applied twice to the programming elements (S104). Namely, as shown in FIG. 8B, two writing pulses are applied to the programming elements on the bit line BL2 and the bit line BL6. As a result, the writing pulses are applied to the programming elements in a total of 9 times, which includes the written pulse number applied to the reference elements (See FIG. 9A and FIG. 9B). Wherein, the above step can be done by merely applying twice the writing pulses to the programming elements, and no verification is required. Therefore, the threshold value Vt_0 of the programming elements that are programmed with data "0" is only 2×ΔV greater than the threshold value Vref0 of the reference elements.

Next, in order to form the reference elements for the erasing elements, the writing prohibited voltages are fed to bit lines other than that of the reference elements for the erasing elements, and by taking the written pulse number obtained when the verification of the reference elements for the programming elements is determined as qualified as a basis, the writing pulse is applied one time to the reference elements for the erasing elements (S106). Namely, as shown in FIG. 8C, the bit line BL4 and the bit line BL8 are erasing elements, and thus the writing pulse is applied one more time to the reference elements for the erasing elements on the bit line BL3 and the bit line BL7. As a result, the writing pulses are applied to the reference elements for the erasing elements in a total of 8 times. Therefore, as shown in FIG. 9A and FIG. 9B, the threshold value Vref1 of the reference elements for the erasing elements is set to be greater than the threshold value Vref0 of the reference elements for the programming elements, but smaller than the threshold value Vt_0 of the programming elements. Accordingly, the page programming sequence of the word line WL4 is completed.

Moreover, FIG. 9C indicates the changes in the written pulse number when the programming is being performed for a certain number of times. Referring to FIG. 9C, when the number of programming cycle increases, the memory cells are in a state apt to be programmed, and thus the threshold value required thereby can be obtained with a written pulse number less than the ones shown in FIG. 9B.

The result for performing page programming is that the threshold values Vt_1 and Vt_0 of the erasing elements and the programming elements are formed within a distribution width as shown in FIG. 3. In addition, the reference elements for the programming elements maintain the reference data, which becomes the threshold value Vref0, and the reference elements for the erasing elements maintain the reference data, which results in a threshold value of Vref1=Vref0+ΔV. And, the programming elements maintain the data, which results in a threshold value of Vt_0=Vref0+2×ΔV. Moreover, in the page programming sequence, data "0" may be written into any data element.

Then, the reading operation is described as follows. In the reading operation, the data element and the reference element of the selected cell unit are simultaneously being read, currents or voltages flow through the two bit lines of the data element and the reference element are being compared to determine the data stored in the data element by using the sense circuit 170. Specifically, the word line selection circuit 160 selects the memory block and the word line based on the vertical address information Ax, and the selection voltage Vx is applied to the selected word line. The selection voltage Vx, for example, is set between the threshold value Vref1 of the reference elements for the erasing elements and the threshold value Vt_0 of the programming elements that are shown in FIG. 3. In addition, the reading voltage Vread (i.e. 4.5 V), which is able to conduct the programming elements, is applied to the un-selected word line. Based on the horizontal address information Ay, the sense circuit 170 enables the current to flow through the selected bit line in order to perform sensing. If one bit line is connected with the programming elements, then current does not flow through the bit line, and a current corresponded to the threshold value Vref0 of the reference elements for the programming elements flows through another bit line. Moreover, if one bit line is connected with the erasing elements, then a current corresponded to the threshold value Vt_1 of the erasing elements flows through the bit line, and a current corresponded to the threshold value Vref1 of the reference elements for the erasing elements flows through another bit line, such that this current is smaller than the current that flows through the erasing element.

Taking FIG. 8A, FIG. 8B and FIG. 8C for examples, the selection voltage Vx is applied to the selected word line WL4, and the reading voltage Vread is applied to un-selected word lines. When reading the data element on the bit line BL2 based on the horizontal address information Ay, the sense amplifier in the sense circuit 170 that is connected to the cell unit U1 is being activated, and the rest of the sense amplifiers are still in an inactivated state. A difference between the currents or the voltages from the bit line BL1 and the bit line BL2 is detected via the sense amplifier. Now, the sense circuit 170 detects that the threshold value Vt_0 of the data element on the bit line BL2 is greater than the threshold value Vref0 of the reference element on the bit line BL1.

In addition, when reading the data element on the bit line BL4, the cell unit containing the reference element that is paired with the data element is also being read. Now, the data element is the erasing element stored with data "1", and thus reference data being the threshold value Vref1 is stored in the reference element. The sense circuit 170 detects that the threshold value Vref1 of the reference element is greater than the threshold value Vt_1 of the erasing element.

In the typical flash memory, when performing a page reading, reading is only performed after all the bit lines are precharged, and thus it is very time-consuming to perform reading. Contrarily, in the flash memory of the present embodiment, it only requires compare the voltages or the currents between a pair of data element and reference element on the bit line, and thus a high speed sensing can be achieved. Moreover, the present embodiment is not limited to the reading of page units, such that the reading of bit units is also possible.

Next, the erasing operation is described as follows. The erasing operation selects the memory block in a manner same as the typical flash memory, and data of the memory cells in the memory block are erased all together according to the bias condition shown in Table 1. And, as described above, when performing the erasing operation of the memory block, the controller 150 controls the page programming sequence to reverse the positions of the reference elements and the data elements, as shown in FIG. 6A and FIG. 6B.

In the above embodiment, the written pulse number of the programming elements is more than the written pulse number of the reference elements for the programming elements by 2, but this is just an example; and if a larger margin is required, then the additional written pulse number may be more than 2. Now, the written pulse number of the reference elements for the erasing elements may also be 1 less than or much less than the written pulse number of the programming elements.

Thereby, in the above embodiment, in the page programming sequence, no verification is required during the writing of the programming elements (S104) and the writing of the reference elements of the erasing elements (S106) as shown in FIG. 7, but the invention is not limited thereto, such that verification may also be performed to determine whether the required threshold values Vt_0 and Vref1 are reached. Now, a verification voltage is to apply a voltage corresponded to Vref1 and Vt_0.

Further, in the above embodiment, the threshold value Vref0 of the reference elements is a positive voltage, but not limited thereto. The threshold value Vref0 may also be 0 V or a negative voltage. Thus, during the reading operation, the selection voltage Vx applied to the selected word line only has to be able to determine the threshold value Vt_1 of the erasing elements, the threshold value Vt_0 of the programming elements and the threshold value Vref0 or Vref1 of the reference elements, such that the threshold values of the memory cells may also be selected with the selection voltage Vx being equal to 0.

Although the invention have been described in detail with reference to the preferred embodiments, it will be apparent to one of the ordinary skill in the art that the invention is not limited to particular embodying manners, and modifications, variations and changes to the described embodiment may be made without departing from the spirit of the invention. Accordingly, the scope of the invention will be defined by the attached claims not by the above detailed descriptions.

What is claimed is:

1. A semiconductor memory device, comprising:
   a memory array, formed with a plurality of memory cells arranged in a matrix direction;
   a vertical selecting mechanism, coupled to the memory array and selecting the memory cells in a vertical direction of the memory array according to a vertical address signal;
   a horizontal selecting mechanism, coupled to the memory array and selecting the memory cells in a horizontal direction of the memory array according to a horizontal address signal; and
   a controlling mechanism, reading data from the memory cells or writing data into the memory cells, wherein
   a plurality of cell units is disposed in the memory array, each cell unit is consisted of a data memory cell for storing data and a reference memory cell for storing reference data, and one data memory cell is not adjacent to another data memory cell in both a vertical direction and a horizontal direction thereof, and
   the controlling mechanism performs a reading operation, a programming operation or an erasing operation to one cell unit selected by the vertical selecting mechanism and the horizontal selecting mechanism.

2. The semiconductor memory device as recited in claim 1, wherein the controlling mechanism comprises a sense circuit connected to a bit line of the memory cells, the data memory cell and the reference memory cell of the selected cell unit are simultaneously being read when performing a reading operation, and the sense circuit compares currents read from the data memory cell and the reference memory cell to determine the data stored in the data memory cell.

3. The semiconductor memory device as recited in claim 1, wherein
   when performing a programming operation, the controlling mechanism writes a value for determining the data in the data memory cell of the selected cell unit into the reference memory cell of the selected cell unit.

4. The semiconductor memory device as recited in claim 3, wherein
   the data memory cell writes a first reference data into the reference memory cell when storing a first data, and the data memory cell writes a second reference data different from the first reference data into the reference memory cell when storing a second data.

5. The semiconductor memory device as recited in claim 4, wherein
the controlling mechanism writes the first data, the first reference data and the second reference data by applying a writing pulse.

6. The semiconductor memory device as recited in claim 4, wherein
a written pulse number of the first reference data is less than a written pulse number of the first data, and a written pulse number of the second reference data is between the written pulse number of the first data and the written pulse number of the first reference data.

7. The semiconductor memory device as recited in claim 6, wherein
when the written pulse number of the first data is N1, the written pulse number of the first reference data is R1, and the written pulse number of the second reference data is R2, then R1=N1−2 and R2=N1−1.

8. The semiconductor memory device as recited in claim 1, wherein
the controlling mechanism performs an erasing operation to the memory array in units of blocks, and the controlling mechanism further reverses positions of the data memory cells and the reference memory cells in the cell units in a block underwent the erasing operation.

9. The semiconductor memory device as recited in claim 1, wherein the memory array is a NAND flash memory array.

10. A reading method suitable for a semiconductor memory device, the semiconductor memory device comprising a memory array formed with a plurality of memory cells arranged in a matrix direction, the reading method comprising:
reading the memory array disposed with a plurality of cell units based on a vertical address information and a horizontal address information, wherein each cell unit is constituted of a data memory cell for storing data and a reference memory cell for storing reference data, and one data memory cell is not adjacent to another data memory cell in a vertical direction and a horizontal direction thereof; and
comparing currents read from the data memory cell and the reference memory cell of the selected cell unit to determine the data stored in the data memory cell.

11. A programming method suitable for a semiconductor memory device, the semiconductor memory device comprising a memory array formed with a plurality of memory cells arranged in a matrix direction, the writing method comprising:
programming the memory array disposed with a plurality of cell units based on a vertical address information and a horizontal address information, wherein each cell unit is constituted of a data memory cell for storing data and a reference memory cell for storing reference data, and one data memory cell is not adjacent to another data memory cell in a vertical direction and a horizontal direction thereof; and
writing the data memory cell of the selected cell unit according to a written data, and writing a value depending on the written data into the reference memory cell thereof.

12. The programming method as recited in claim 11, wherein
writing a first reference data into the reference memory cell when storing a first data into the data memory cell, and writing a second reference data different from the first reference data into the reference memory cell when storing a second data into the data memory cell.

13. The programming method as recited in claim 12, wherein
the first data, the first reference data and the second reference data are being written through applying a writing pulse.

14. The programming method as recited in claim 13, wherein
a written pulse number of the first reference data is less than a written pulse number of the first data, a written pulse number of the second reference data is between the written pulse number of the first data and the written pulse number of the first reference data.

15. The programming method as recited in claim 14, wherein
when the written pulse number of the first data is N1, the written pulse number of the first reference data is R1, and the written pulse number of the second reference data is R2, then R1=N1−2 and R2=N1−1.

16. The programming method as recited in claim 11, wherein the memory array is a NAND flash memory array.

* * * * *